United States Patent
Johnston et al.

(10) Patent No.: US 9,240,517 B2
(45) Date of Patent: Jan. 19, 2016

(54) STRAIN RELIEF SUPERLATTICES AND OPTOELECTRONIC DEVICES INCLUDING THE SAME

(71) Applicants: David W. Johnston, Kensington, NH (US); Richard Speer, Concord, MA (US); Joseph Laski, Stoneham, MA (US); Kailash C. Mishra, North Chelmsford, MA (US)

(72) Inventors: David W. Johnston, Kensington, NH (US); Richard Speer, Concord, MA (US); Joseph Laski, Stoneham, MA (US); Kailash C. Mishra, North Chelmsford, MA (US)

(73) Assignee: OSRAM SYLVANIA INC., Wilmington, MA (US)

( * ) Notice: Subject to any disclaimer, the term of this patent is extended or adjusted under 35 U.S.C. 154(b) by 29 days.

(21) Appl. No.: 14/186,483

(22) Filed: Feb. 21, 2014

(65) Prior Publication Data

US 2015/0243840 A1    Aug. 27, 2015

(51) Int. Cl.
| | |
|---|---|
| *H01L 29/06* | (2006.01) |
| *H01L 33/12* | (2010.01) |
| *H01L 33/06* | (2010.01) |
| *H01L 33/32* | (2010.01) |

(52) U.S. Cl.
CPC ............... *H01L 33/12* (2013.01); *H01L 33/06* (2013.01); *H01L 33/32* (2013.01)

(58) Field of Classification Search
CPC .......... H01L 33/12; H01L 33/06; H01L 33/32
USPC ............................................... 257/13, 15, 17
See application file for complete search history.

(56) References Cited

U.S. PATENT DOCUMENTS

| | | | | |
|---|---|---|---|---|
| 4,088,515 A | * | 5/1978 | Blakeslee | ............... B82Y 20/00 117/102 |
| 2004/0120375 A1 | * | 6/2004 | Kwon | .................... B82Y 20/00 372/45.012 |
| 2012/0187540 A1 | * | 7/2012 | Hooper | ............... H01L 21/0237 257/615 |

OTHER PUBLICATIONS

Structural analysis of strained p-type AlGaN/GaN superlattice, Journal of Applied Physics 101, 023521 (2007), H.L. Tsi, T.Y. Wang, and J.R. Yang.
Growth and characterization of Mg-doped AlGaN-AlN short-period superlattices for deep-UV optoelectronic devices, Journal of Crystal Growth 312 (2010) 756-761, A.A. Allerman, M.H. Crawfor, M.A. Miller, S.R. Lee.
Light-Emitting Diode Second Edition, E. Fred Schubert, Rensselaer Polytechnic Institute, Cambridge University Press (2006).
Model of superlattice yield stress and hardness enhancements, American Institute of Physics 77(9), May 1, 1995, Xi Chu and Scott A. Barnett.

(Continued)

*Primary Examiner* — Long K Tran
(74) *Attorney, Agent, or Firm* — Andrew Martin (57) ABSTRACT

Structures for transitioning between two layers of differing lattice parameters are disclosed. In some embodiments, the structures are in the form of a superlattice that serves as a strain relieving transition between two layers of differing lattice parameters. By controlling the properties of the superlattice, the superlattice can exhibit desirable properties such as transparency to light and lattice matching to one of the two layers of differing lattice parameters. Optoelectronic devices such as light emitting diodes including such superlattices are also disclosed.

19 Claims, 6 Drawing Sheets

(56) References Cited

OTHER PUBLICATIONS

Structural and compositional analyses of a strained AlGaN/GaN superlattice, Jornal of Applied Physics 100, 013110 (2006), M. Shiojiri at el.

AlN/AlGaN superlattices as dislocation filter for low-threading-dislocation thick AlGaN layers on sapphire, Applied Physics Letters vol. 81, No. 4, Jul. 22, 2002, Hong-Mei Wang et al.

\* cited by examiner

STRAIN RELIEF SUPERLATTICES AND OPTOELECTRONIC DEVICES INCLUDING THE SAME

TECHNICAL FIELD

The present disclosure generally relates to the field of material deposition, in particular to thin film deposition. More specifically, the present disclosure relates to structures for transitioning between two thin film layers having differing lattice parameters, and optoelectronic devices including such structures,

BACKGROUND

Misfit dislocations often arise when a second thin film layer is deposited on a first thin film layer. This is particularly true in instances where the first and second thin film layers have different in-plane lattice parameters. In such instances, initial growth of the second thin film layer may be commensurate to the in-plane lattice parameters of the first layer. As growth of the second thin film layer continues, misfit strain may build within the second thin film layer due to the difference in lattice parameters between the first and second layers. Eventually, misfit or other dislocations will arise in the second thin film layer to relieve this strain. The thickness at which misfit dislocations arise in a thin film layer is known in the art as the "critical thickness."

With the foregoing in mind, thin film technology is often used to produce optoelectronic devices such as light emitting diodes. For example, some LEDs may be formed from a plurality of thin film layers that are deposited on a substrate. Due to differences in the lattice parameters of the substrate and the layers grown thereon (or between subsequent successive layers), misfit dislocations may arise. Such dislocations can reduce the optical efficacy of the LED, and may increase the electrical resistance of n and p type semiconductive layers/regions used therein. This is particularly problematic in the case of LEDs that include active regions designed to emit ultraviolet light, wherein misfit dislocations may play a significant role as non-radiative recombination centers.

BRIEF DESCRIPTION OF THE DRAWINGS

Reference is now made to the following detailed description which should be read in conjunction with the following figures.

DETAILED DESCRIPTION

Misfit dislocations can negatively impact the performance of optoelectronic devices such as ultraviolet (UV) light emitting LEDs. With this in mind, semiconductor nitrides such as aluminum gallium nitrides ($Al_xGa_{1-x}N$, where $0<x<1$) have been identified as promising compositions for the production of semiconductive and UV emitting active regions/layers in LED structures. Although $Al_xGa_{1-x}N$ active regions are capable of emitting substantial quantities of ultraviolet light, the inventors are not aware of any substrates that have lattice parameters that match $Al_xGa_{1-x}N$. Indeed, the lattice parameters of $Al_xGa_{1-x}N$ may differ significantly (e.g., by as much as 13% or more) from a sapphire or a gallium nitride on sapphire (GaN/sapphire) substrate. Due to this difference in lattice parameters, large numbers of misfit dislocations may be generated in an $Al_xGa_{1-x}N$ layer that is deposited on a conventional LED substrate. Such dislocations may compromise the optical efficacy and/or other properties of the device.

One aspect of the present disclosure is drawn to the use of a superlattice as a structure to transition between two layers that have different lattice parameters. As will be described below, controlling various properties of a superlattice formed on a first layer may allow the superlattice (and in particular an upper surface thereof) to exhibit one or more lattice parameters that match or substantially match corresponding lattice parameters of a second layer to be deposited thereon. This may limit or even eliminate the generation of misfit dislocations in the second layer as the second layer is grown on the superlattice. Moreover by controlling factors such as the average weighted composition of the superlattice, it may be possible for the superlattice to exhibit desirable properties for use in optoelectronic devices, such as but not limited to transparency to light emitted from an active region of an LED.

For the sake of illustration, the present disclosure often focuses on embodiments wherein a superlattice is used to transition between first and second layers of an optoelectronic device, such as between a substrate (or subsequent layer) and a semiconductive layer that may be used in an LED. Such discussion should be considered exemplary only, and it should be understood that the present disclosure is not limited to the use of superlattices in optoelectronic devices. Indeed, the superlattices described herein may be suitably used to transition between layers having different lattice parameters in any context. For example, the technologies described herein may be used in any electronic device that is composed of epitaxial film layers that do not or cannot lattice match to the host substrate (e.g., silicon/germanium thin film layers on a silicon substrate).

One or more aspects of the present disclosure may be described using numerical ranges. Unless otherwise indicated herein, any recited range should be interpreted as including any and all iterative values between the indicated endpoints, as if such iterative values were expressly recited. Such ranges should also be interpreted as including any and all ranges falling within or between such iterative values and/or recited endpoints, as if such ranges were expressly recited.

For purpose of the present disclosure it is to be understood that when one (first) layer is referred to as being "on" another (second) layer, the first layer may be directly on the second layer, or one or more intervening layers may be present between the first and second layers. In contrast, when one (first) layer is referred to as being "directly on," a another (second) layer, no intervening layers are present between the first and second layers.

The terminology used herein is for the purpose of describing particular embodiments only and is not intended to be limiting. For example, the singular terms "a," "an" and "the" are intended to include their plural forms as well, unless the context clearly indicates otherwise.

In the present disclosure, the term "superlattice" is used to refer to a structure that is formed by a plurality of periods, wherein each period includes at least two thin film layers of differing composition. For the sake of clarity, the present disclosure focuses specifically on the use of superlattices that are formed by a plurality of periods, wherein each period includes first and second thin film layers that differ in composition. It should be understood however that the superlattices described herein are not limited to those having periods defined by only two layers. Thus for example the superlattices described herein may include a plurality of periods, wherein each period includes x layers of differing composition, where x is two or more (e.g., three, four, five, six, etc.). Accordingly, the superlattices described herein may be generally understood as a thin film structure that is formed by a plurality of alternating or repeating thin film layers of differing composition.

The thickness of a superlattice, its constituent periods, and the thin films therein may impact one or more of the superlattice's properties. For the sake of clarity, the symbols $T_{SL}$ and $T_P$ are used herein to designate the total thickness of a superlattice and a thickness of a period within a superlattice, respectively. Similarly, the symbols $T_1$ and $T_2$ are used herein to respectively designate the thickness of first and second layers in a two layer period of a superlattice. Instances where a superlattice period includes more than two layers, the symbol $T_x$ (where x is 3 or more) is used to designate the thickness of a third (or another) layer in a period under consideration.

In some instances the present disclosure will describe $T_{SL}$, $T_P$, $T_1$, $T_2$, and/or $T_x$ in relation to their respective "critical thickness." As is generally understood in the art of thin film deposition, the critical thickness is a thickness above which misfit dislocations appear in a deposited layer or structure, e.g., so as to relieve misfit strain within the layer. In the context of superlattices, it may therefore be understood that each layer and period in a superlattice may have its own critical thickness, and that a superlattice as a whole may also have a critical thickness. The manner in which such critical thicknesses may be calculated or otherwise determined is well understood in the art, and thus is not described herein. For a discussion of critical thicknesses and the manner in which they may be calculated, reference is made to the calculations described in Fischer et al., Physical Review Letters, vol 73 #20, Nov. 14, 1994 and Kim et al, Applied Physics Letters, vol. 69, number 16, Oct. 14, 1996.

For the sake of clarity, the present disclosure uses the terms $h_{csl}$ and $h_{cp}$ to refer to the critical thickness of a superlattice and a period contained therein, respectively. Similarly, the terms $h_{c1}$ and $h_{c2}$ are used herein to refer to the critical thickness of first and second thin film layers in a two layer period of a superlattice. In instances where a period includes more than two thin film layers, the term $h_{cx}$ (where x is 3 or more) is used to refer to the critical thickness of the third (or additional) layer in the period under consideration.

The number of periods used in the superlattices described herein may vary widely. For example, the superlattices described herein may include y periods, wherein y is a positive integer greater than or equal to 2, such as greater than or equal to 10, 20, 30, 40, 50, 60 70, 80, 100, 500, 1000, or more. The specific number of periods that may be desirably used in a superlattice may be dependent on several factors, including but not limited to $T_P$, $T_{SL}$, $h_{cSL}$, and combinations thereof. In some embodiments, the number of periods in a superlattice is selected such that $T_{SL}$ is greater than $h_{cSL}$.

Figure 1:
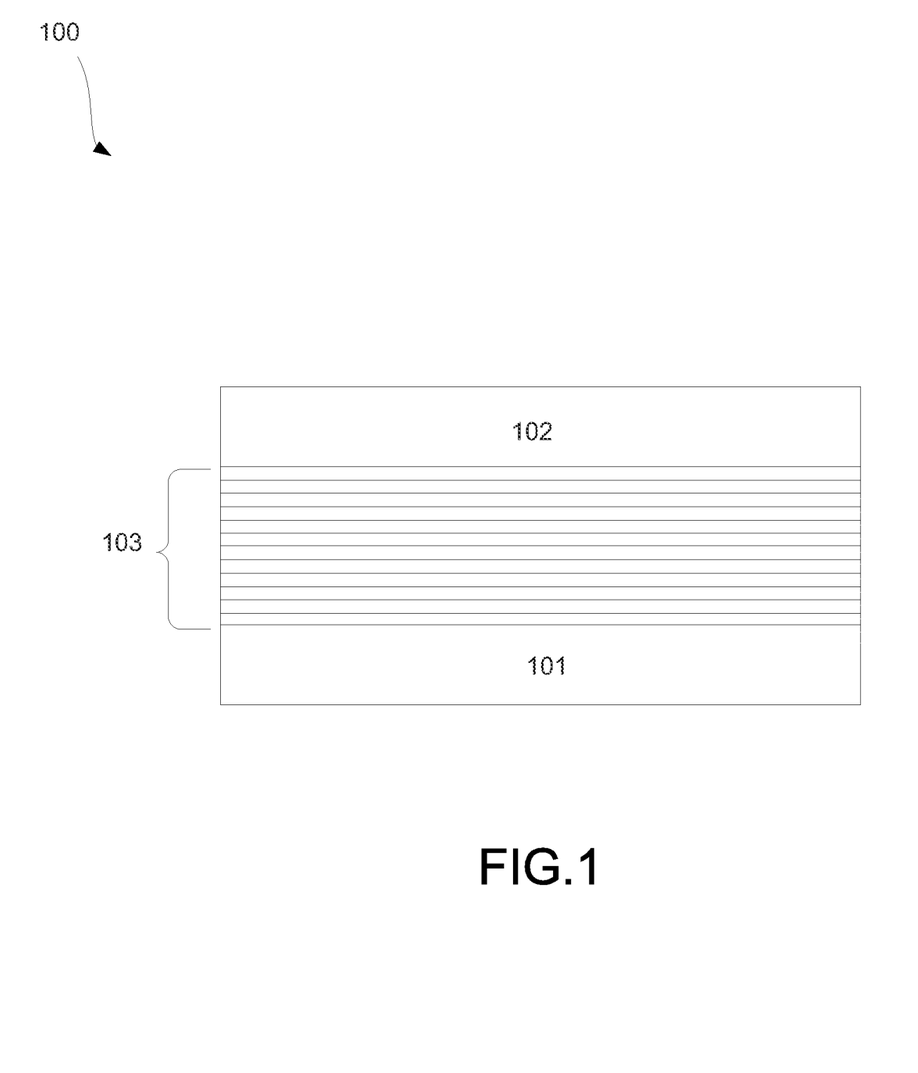
FIG. 1 is a cross sectional view of a generic structure in which an exemplary superlattice consistent with the present disclosure transitions between two layers that have different lattice parameters.

Reference is now made to FIG. 1, which illustrates one example of the use of a superlattice consistent with the present disclosure to transition between two layers that have different lattice parameters. As shown, layer stack 100 includes underlayer 101, overlayer 102, and a superlattice 103. Underlayer 101 and overlayer may be any thin film layers suitable for use in a thin film structure, including those that may be found in a wide variety of devices. For example, underlayer 101 and overlayer 102 may respectively correlate to successive layers that in a thin film structure, such as may be found in a semiconductor devices (e.g., an optoelectronic device), optical filters, multilayer thin film coatings, or the like. Alternatively or additionally, underlayer 101 may correlate to a substrate upon which overlayer 102 (e.g., a thin film layer) is to be deposited. For example, underlayer 101 may be a substrate of an optoelectronic device such as an LED, and overlayer 102 may correspond to a thin film semiconductive layer overlying the substrate, as will be further explained in connection with FIGS. 3-5.

Regardless of the end use in which stack 100 is used, underlayer 101 and overlayer 102 are two layers that have different lattice parameters. For example, underlayer 101 may have a first in-plane lattice parameter and overlayer 102 may have a second in-plane lattice parameter, wherein the first and second lattice parameters are different. In some embodiments, the first in-plane lattice parameter of underlayer 101 is smaller than the second in-plane lattice parameter of overlayer 102. In other embodiments, the first in-plane lattice parameter of underlayer 101 is larger than the second in-plane lattice parameter of overlayer 102.

Therefore consistent with the foregoing discussion, if overlayer 102 were deposited (e.g., grown) directly on underlayer 101 using a thin film deposition technique (e.g. physical vapor deposition, chemical vapor deposition, molecular beam epitaxy, etc.), atoms of overlayer 102 may be initially commensurate to the first lattice parameter of underlayer 101. As the thickness of overlayer 102 increases however, misfit strain may build until the critical thickness of overlayer 102 is reached. At that point, misfit dislocations may appear in overlayer 102 to relieve the misfit strain, and subsequently deposited atoms of overlayer 102 may be laid down in accordance with its second lattice parameter. Left unchecked, such misfit dislocations may be carried forward into subsequent layers (not shown) that may be deposited on overlayer 102.

With the foregoing in mind, superlattice 103 is generally configured to serve as a transition between underlayer 101 and overlayer 102. More particularly, superlattice 103 may be configured to serve as a transition that limits or prevents the movement of misfit dislocations from underlayer 101 to overlayer 102. For example and as will be described below in connection with FIG. 2, superlattice 103 may be configured to isolate dislocations at the interface between it and underlayer 101. As a result, superlattice 103 may serve as a defect free layer/substrate, upon which other layers (e.g., overlayer 102) may be deposited. This may prevent the migration/translation of misfit and/or other dislocations that may be present in underlayer 101 to overlayer 102.

As will also be described below, superlattice 103 may also be configured to limit or prevent the formation of new misfit dislocations in a subsequently formed layer, such as overlayer 102. In this regard, it is noted that the amount (allowance) of lattice mismatch between overlayer 102 and underlayer 101 that may be permitted (without generation of misfit dislocations in overlayer 102) may in some embodiments be a function of the critical thickness of superlattice 103 and/or subsequently layers. For example, lattice mismatch between overlayer 102 and underlayer 101 may increase as the critical thickness of superlattice 103 decreases, and vice versa.

The tolerance limit for dislocation density may be dictated by the functionality of the device in question and the materials used. Once this dislocation density limit is known, it may be possible to calculate the upper limit of tolerable lattice mismatch. Adjusting the composition and/or thickness of the superlattice layer and the thickness of subsequent layers may enable the device to remain below the mismatch limit. The associated parameters of the device could be obtained from the device performance experimentally.

With the foregoing in mind, in some embodiments superlattice 103 may be formed such that it exhibits one or more lattice parameters (e.g., at an upper surface thereof) that match or substantially match corresponding lattice parameter(s) of overlayer 102, e.g., the second lattice parameter described above. In this context, the term "substantially match" means that a lattice parameter (e.g., an in-plane lattice parameter) of superlattice 103 (particularly at a top surface thereof) is within about 5% of the corresponding lattice parameter of overlayer 102, such as within about 1%, within about 0.1%, within about 0.01%, or even within about 0.001% of the corresponding lattice parameter of overlayer 102. Without limitation, superlattice 103 is preferably configured such that a lattice parameter thereof (e.g., an in-plane lattice parameter) at an upper surface thereof is within about 0.1% of a corresponding lattice parameter of overlayer 102.

In some embodiments, superlattice 103 may be configured such that its lattice parameter(s) change(s) from a bottom surface thereof to a top surface thereof. For example, superlattice 103 may be configured such that the plane lattice parameter at its bottom surface is relatively close to the first in-plane lattice parameter of underlayer 101, but the in-plane lattice parameter at its top surface matches or substantially match the second in-plane lattice parameter of overlayer 102. This change in lattice parameter may occur gradually between the bottom and top surfaces of superlattice 103 (e.g., as a gradient), in a stepwise manner, or in some other manner. Without limitation, the change in lattice parameter (if present) occurs in a gradual manner, e.g., as a gradient from the bottom to the top surfaces of superlattice 103.

Of course, superlattice 103 need not be configured to exhibit a change in lattice parameter. Rather, superlattice 103 may be configured such that its lattice parameter(s) are fall between the first and second lattice parameters of underlayer 101 and overlayer 102, respectively. In such instances, superlattice 103 preferably exhibits a lattice parameter that is closer to the second lattice parameter of overlayer 102 than it is to the first lattice parameter of underlayer 101.

When superlattice 103 (or at least an upper surface thereof) exhibits a lattice parameter that matches or substantially matches a lattice parameter of overlayer 102, growth of overlayer 102 on superlattice 103 (e.g., a top surface thereof) may occur without buildup of misfit strain, or with a buildup of misfit strain that is reduced relative to that which may accrue when overlayer 102 is deposited directly on underlayer 101. Without wishing to be bound by theory, it is believed that when a superlattice 103 (e.g., an upper surface thereof) has a lattice parameter that matches or substantially matches a lattice parameter of overlayer 102, atoms of overlayer 102 may be deposited such that they register or substantially register with the atoms at the upper surface of superlattice 103. In other words, atoms of overlayer 102 may be epitaxially deposited on the upper surface of superlattice 103 in accordance with their natural lattice parameters, e.g., the second lattice parameter noted above. As a result, misfit strain may be eliminated or reduced in overlayer 102, resulting in a corresponding reduction or elimination of misfit dislocations within second layer 102.

Figure 2:
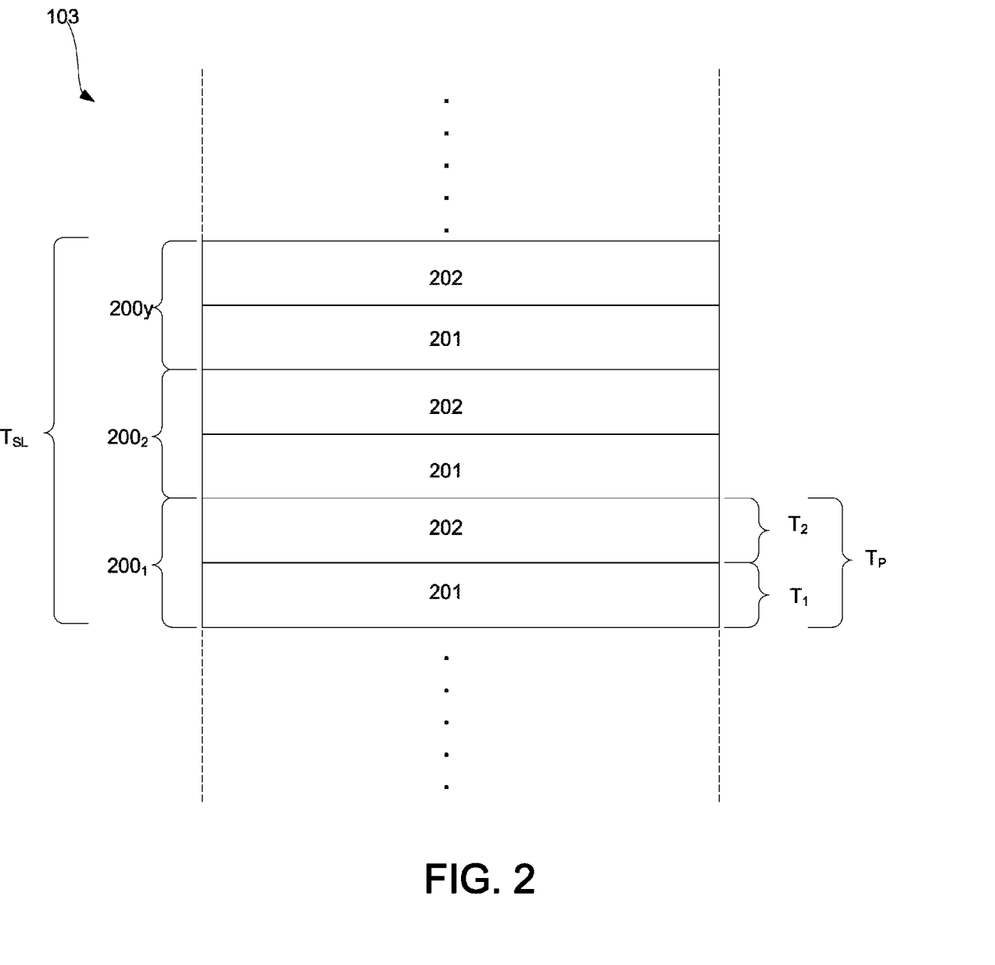
FIG. 2 is a cross sectional view of an exemplary light emitting diode including a superlattice structure consistent with the present disclosure.

Reference is now made to FIG. 2, which provides a detail cross sectional view of an exemplary superlattice consistent with the present disclosure. As shown, superlattice 103 includes a plurality of periods $200_1$, $200_2$, $200_y$, where y is greater than or equal to 3. Each period includes a first layer 201 and a second layer 202. First and second layers 201, 202 may be formed from any suitable material, provided that they differ in composition. More generally, first layers 201 may be formed from a first material, and second layer 202 may be formed from a second material, wherein the first and second materials are different from one another.

As non-limiting examples of suitable materials that may be used to form first and second layers 201, 202, mention is made of metal nitrides such as aluminum nitride (AlN), gallium nitride (GaN), aluminum gallium nitride ($Al_xGa_{1-x}N$), indium nitride (InN), indium gallium nitride (InGaN), combinations thereof, and the like. Of course, such materials are exemplary only, and any suitable material may be used to form first and second layers 201, 202. In some embodiments, first and second layers 201, 202 are different in composition, and are formed from one of GaN, AlN, or $Al_xGa_{1-x}N$. As may be appreciated, such layers may be used to create a superlattice having an average weighted composition that may equal or nearly equal the composition of a GaN, AlN, or $Al_xGa_{1-x}N$ layer to be deposited on the superlattice, as will be discussed later in conjunction with FIGS. 4 and 5.

In some embodiments, the materials used to form first and second layers 201, 202 may be selected based on difference in their respective elastic moduli. For example, in some embodiments first layer 201 may be formed from a first composition that has an elastic modulus that differs from the elastic modulus of a second composition used to form second layer 202. In some embodiments, the first composition exhibits an elastic modulus that differs from the elastic modulus of the second composition by greater than or equal to about 5 to about 100 or more %. As may be appreciated, the larger the difference in the elastic moduli between layers of superlattice 103, the less likely it is for dislocations in underlayer 101 to propagate through superlattice 103 to overlayer 102. With this in mind, in one example superlattice 103 may be formed from alternating AlN and GaN layers, as opposed to alloys of AlN and GaN. In such instance, the average weighted composition of superlattice 103 may be adjusted to substantially match that of overlayer 102 by adjusting the thickness of the individual layers. Preferably, each of the individual layers remains below hc, but is larger than their individual surface roughness.

The materials used to form first and second layers 201, 202 may also be selected based on the composition of an overlayer to be deposited on superlattice 103, such as overlayer 102. For example, where an overlayer is formed of an alloy, e.g., an alloy metal nitride such as $Al_xGa_{1-x}N$, the composition of first and second layers may be selected such that the superlattice may exhibit an average weighted composition that matches or nearly matches the composition of the overlayer. In some embodiments, this means that the average weighted composition of superlattice 103 is within +/−15% of overlayer 102, such as within about 10%, within about 5%, or even within about 1%. In the $Al_xGa_{1-x}N$ example, this may be achieved by forming first and second layers 201, 202 from AlN, GaN, $Al_xGa_{1-x}N$, or different $Al_xGa_{1-x}N$ alloys, such as $Al_xGa_{1-x}N$ alloys containing less than 50 atomic % Al or Ga, as will be discussed later in connection with FIGS. 3-5.

Without limitation, the materials forming first and second layers 201, 202 are preferably selected not only for their capability to form a superlattice having an average weighted composition matching or nearly matching an overlying layer, but also for the fact that they exhibit elastic constants that significantly differ from one another (e.g., are as different as possible). With this in mind, in the embodiment wherein an $Al_xGa_{1-x}N$ overlayer will be deposited on superlattice 103, first and second layers 201, 202 are preferably formed from AlN and GaN, respectively.

For the sake of clarity, superlattice 103 is illustrated in FIG. 2 as including a plurality of periods $200_1$, $200_2$, $200_n$, wherein each period includes identical first and second layers 201, 202. It should be understood that such illustration is exemplary, and the composition of first and second layers 201, 202 may vary between periods. Although such structures may vary somewhat from a superlattice in the strict sense, they may be useful in some applications. For example, period $200_1$ may include first and second layers 201, 202 formed from first and second materials, respectively (e.g., AlN and GaN), whereas second period $200_2$ may include first and second layers 201, 202 formed from third and fourth materials, (e.g., AlN and $Al_xGa_{1-x}N$, respectively).

As further shown in FIG. 2, first layers 201 are formed to thickness $T_1$ and second layers 202 are formed to a thickness $T_2$. Such thicknesses may vary widely, provided that they are below the critical thickness of their respective layers and will lead to the targeted average weighted composition for the superlattice. That is, thickness $T_1$ may be any thickness below the critical thickness $h_{c1}$ of first layer 201, and thickness $T_2$ may be any thickness below the critical thickness $h_{c2}$ of second layer 202. Similarly, periods $200_1$, $200_2$, $200_n$ of superlattice 103 may each be formed to a thickness $T_P$, which may also vary widely provided that it remains below the critical thickness $h_{CP}$ of the period in question. In the case of an AlN/GaN superlattice for example, in some embodiments the thickness of the AlN layers may vary from about 2.5 angstroms to about 27.4 angstroms, and the thickness of the GaN layers may vary from about 2.6 angstroms to about 25.9 angstroms.

The inventors have discovered that when $T_1$, $T_2$, and $T_P$ are below their respective critical thicknesses, superlattice 103 may exhibit significantly enhanced strength, relative to its constituent layers (e.g., layers 201, 202) and, in some embodiments relative to the strength of underlayer 101 or overlayer 102. Without wishing to be bound by theory, it is believed that due to this strength superlattice 103 may prevent or limit to migration/translation of misfit dislocations that may be present in underlayer 101 from translating through to overlayer 102. Indeed in some embodiments, such dislocations may be isolated to and/or aggregate at an interface between superlattice 103 and underlayer 101.

In instances where superlattice 103 is to be used in an optoelectronic device such as an LED, the composition and thicknesses of first and second layers 201, 202 may also be selected such that superlattice 103 exhibits desirable optical properties, such as transparency to light emitted from an active region of the LED. In instances where an active region of an LED utilizes an active region that emits ultraviolet light for example, the first and second layers 201, 202 may be configured such that superlattice is transparent to ultraviolet light. Put in other terms, first and second layers 201, 202 may be configured to transmit greater than or equal to about 50% of incident ultraviolet light, such as greater or equal to about 60%, 70%, 80%, 90%, or even 100% of incident ultraviolet light.

As will be discussed later in connection with FIGS. 3-5, in some embodiments the superlattices described herein may be used in an LED that includes an n-doped semiconductive layer formed from an $Al_xGa_{1-x}N$ alloy, as well as an active region (e.g. a multiple quantum well (MQW) structure) that includes an $Al_xGa_{1-x}N$ alloy configured to emit ultraviolet light. For the reasons noted above, it may be desirable to form first and second layers 201, 202 from AlN, GaN, or $Al_xGa_{1-x}N$, such that the average weighted composition of superlattice 103 matches or nearly matches the composition of the n-doped semiconductive layer. Because GaN does not transmit ultraviolet light however, the compositions and thicknesses of first and second layers 201, 202 should also be selected such that the average weighted composition of superlattice 103 contains more aluminum than the active region of the LED. More particularly, the composition and thickness of first and second layers 201, 202, are selected such that the average weighted composition of superlattice 103 contains more aluminum than the $Al_xGa_{1-x}N$ alloy used in the active region of the LED. In such instances, superlattice 103 will be at least partially transparent to UV light emitted by the active region.

As further shown in FIG. 2, superlattice 103 may have a thickness $T_{SL}$ that is equivalent to the sum of the thickness of each of its constituent periods (e.g., period $200_1$, $200_2$, etc.) and/or the sum of the thickness of each of its constituent layers (e.g., first and second layers 201, 202). $T_{SL}$ may vary widely, depending on the nature of the materials used to form layers 201, 201, the difference in lattice constant between superlattice 103 and underlayer 101, the composition of overlayer 102, or a combination thereof. As may be appreciated, $T_{SL}$ may be controlled by varying the number of periods in superlattice 103.

In some embodiments, $T_{SL}$ is greater than the critical thickness of superlattice 103, i.e., $T_{SL} > h_{cSL}$. Without limitation, the thickness $T_{SL}$ of superlattice 103 is sufficiently above $h_{cSL}$ such that one or more of its lattice parameters is equivalent or substantially equivalent to weighted average lattice parameters of each of first and second layers 201, 202, at which point superlattice 103 may be considered "relaxed." That is, where $\sigma_{SL} = (T_1\sigma_1 + T_2\sigma_2)/(T_1+T_2)$, where $\sigma_{SL}$ is a weighted average lattice parameter (e.g., at the top of the superlattice), and $\sigma_1$ and $\sigma_2$ are a corresponding lattice parameter of the first and second layer in in the last period of the superlattice.

Whether or not a superlattice is relaxed may be determined experimentally by analyzing the superlattice to determine its Poisson's ratio, e.g., using the X-ray diffraction techniques of assymetric and symmetric reciprocal space mapping and the Poisson's ratio for the superlattice components. The lattice parameters a, b and c of the superlattice may then be compared to a weighted average of the "ideal" lattice parameters of the superlattice, which may be calculated or otherwise determined using known methods in the art. When the measured unit cell equals or substantially equals the weighted average "ideal" unit cell, the lattice parameters of the superlattice may be considered equivalent to the weighted average lattice parameters of the first and second layers, and the superlattice may be considered "relaxed."

To generally summarize the foregoing, the superlattices of the present disclosure may be formed of a plurality of periods, wherein each period includes at least first and second layers of differing composition. In some embodiments, the superlattice may be configured such that one or more of the following relationships is met:

(1) $T_1 < hc_1$;
(2) $T_2 < h_{c2}$;
(3) $T_P < h_{CP}$;
(4) $T_{SL} > h_{cSL}$;

(5) the average weighted composition of the superlattice equals or substantially equals the composition of an overlayer to be deposited thereon;

(6) the superlattice exhibits a lattice parameter that equals or substantially equals a lattice parameter of an overlayer to be deposited thereon;

(7) $T_{SL}$ is sufficiently above $h_{cSL}$ that the superlattice is relaxed; and (8) the superlattice is transparent to light emitted from an active region of an optoelectronic device (when used in such a device).

In some embodiments, superlattice 103 is preferably configured to meet relationships 1-6 above. In other non-limiting embodiments, superlattice 103 is configured to meet relationships 1-7 above. Without limitation, superlattice 103 is preferably configured to meet all of the foregoing relationships, particularly when it is used in the context of an optoelectronic device. In such instances, superlattice 103 may provide serve to isolate misfit dislocations at an interface between it and an underlayer, while simultaneously serving as a substrate for epitaxial or near epitaxial growth of one or more overlayers. Moreover, superlattice 103 may also limit or prevent the generation of misfit strain in an overlayer deposited thereon, thereby limiting or preventing the development of new misfit dislocations in the overlayer.

For the sake of illustration, the present disclosure will now proceed to describe the use of a superlattice in the formation of an optoelectronic device, such as an LED. Reference is therefore made to FIG. 3, which depicts one example of an LED including a superlattice consistent with the present disclosure. As illustrated, LED 300 includes substrate 301, optional buffer layer 302, superlattice 103, n-type semiconductive layer 304, active region 305, and p-type semiconductive layer 306.

From the arrangement of the layers, it may be understood that LED 300 is configured such that light emitted from active region 305 may be transmitted through superlattice 103 and substrate 301. It should be understood that this illustration is exemplary, and LED's having other configurations may also be used. For example, LED 300 may be configured such that N-type semiconductive layer 304 is deposited on active region 305, whereas p-type semiconductive layer 306 is deposited on superlattice 103.

Figure 3:
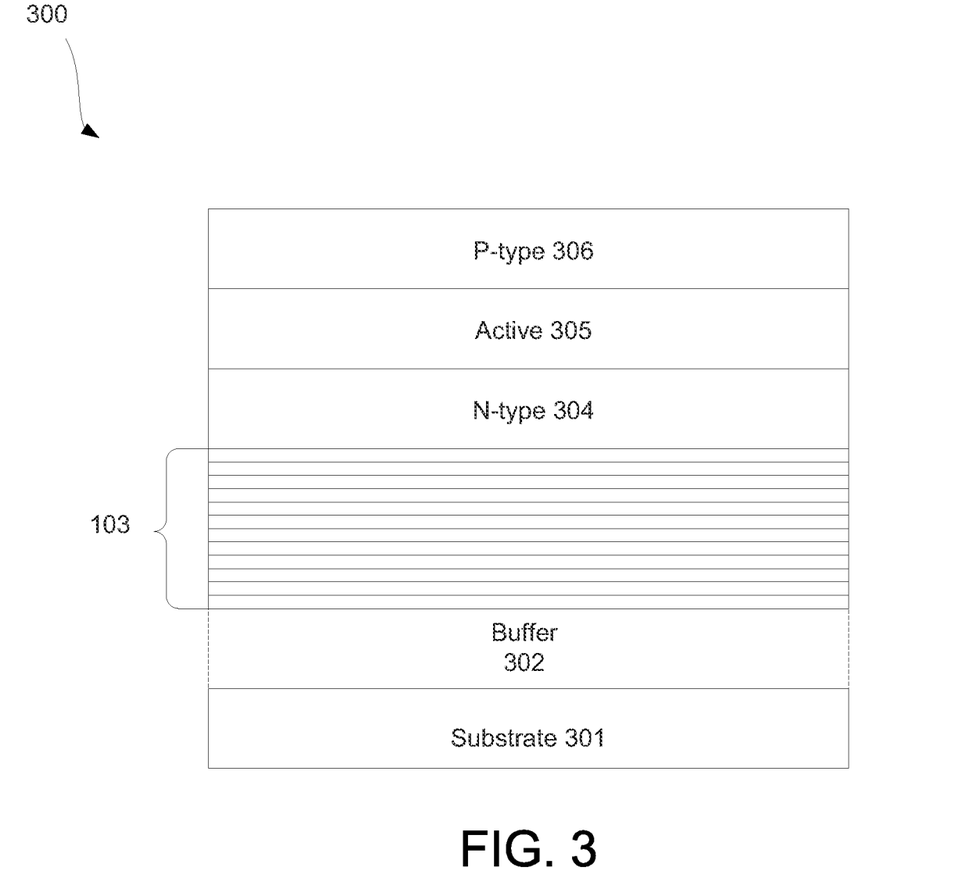
FIG. 3 is a cross sectional detail view of an exemplary superlattice structure consistent with the present disclosure.
Figure 4:
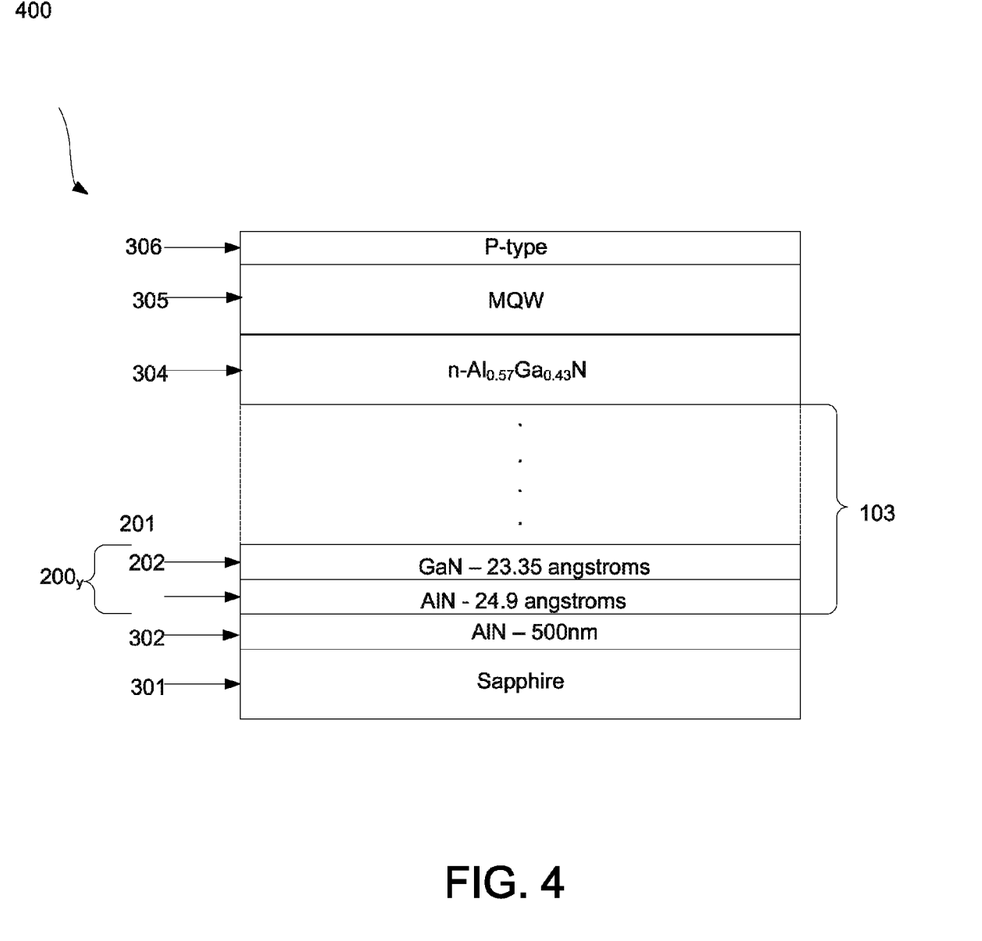
FIG. 4 is a cross sectional view of another exemplary light emitting diode including a superlattice structure consistent with the present disclosure.
Figure 5:
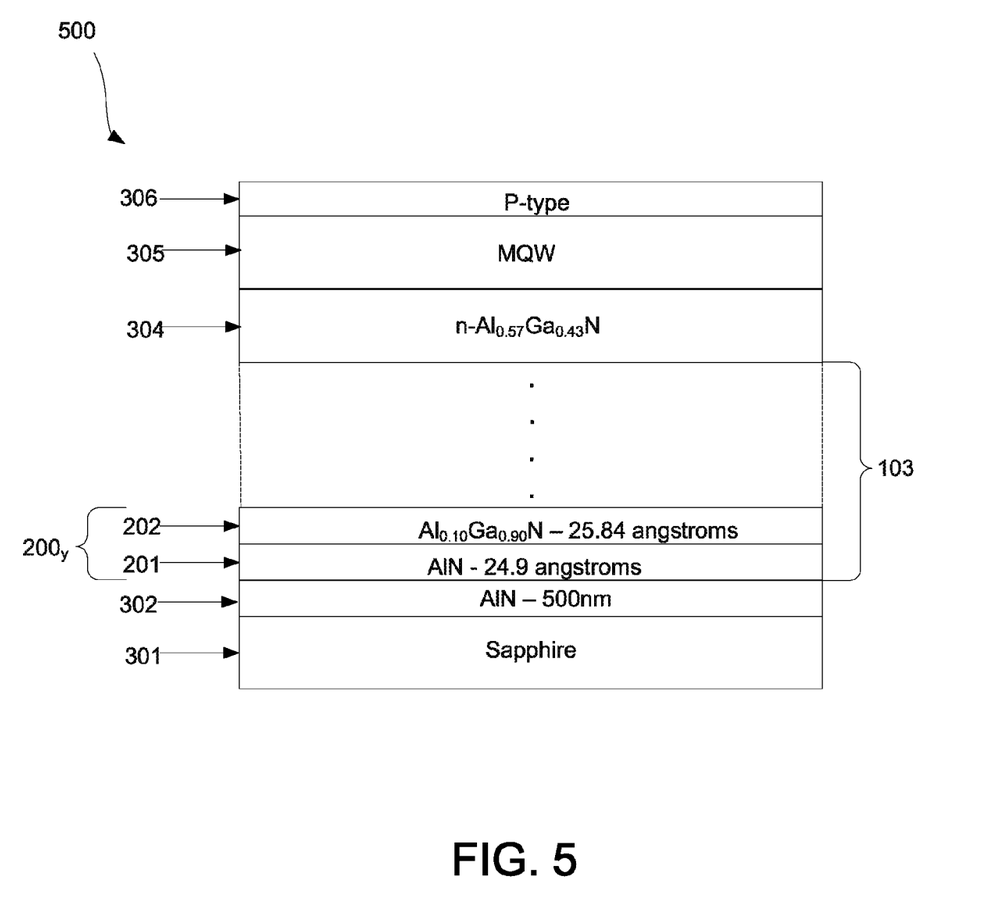
FIG. 5 is a cross sectional view of yet another exemplary light emitting diode including a superlattice structure consistent with the present disclosure.

It is also noted that the LEDs shown in FIGS. 3-5 are illustrated with relatively few components for the sake of simplicity. It should be understood that the LEDs may include other components and/or layers which may be useful in an LED. For example, the LEDs described herein may include one or more reflective layers, other buffer layers, cladding (e.g., index guiding) layers, a capping layer, electrodes, electron and hole blocking layers, current spreading layers, photonic crystal structures, combinations thereof, and the like, any or all of which may be commonly used in light emitting diodes.

Substrate 301 may be formed from any material that is suitable for use in an optoelectronic device. As non-limiting examples of materials that may be suitably used to form substrate 301, mention is made of oxide substrates such as aluminum oxide (e.g., $Al_2O_3$ (i.e., sapphire), aluminum nitride, gallium nitride, germanium, silicon, silicon dioxide ($SiO_2$), titanium dioxide ($TiO_2$), carbide substrates such as silicon carbide (SiC), boron carbide (BC), selenide substrates such as zinc selenide (ZnSe), combinations thereof, and the like. Without limitation, substrate 301 is preferably formed from sapphire.

Substrate 301 may be transparent to light emitted from active region 305, e.g., visible light, ultraviolet light, etc. For example, substrate 301 may transmit greater than or equal to about 50% of incident light emitted from active region 305. In some embodiments, substrate 301 may transmit greater than or equal to about 60%, 70%, 80%, 90% or even 100% of incident light emitted from active region 305.

Although not required, an optional buffer layer 302 may be formed on substrate 301. Optional buffer layer 302 may be configured to have a lattice parameter that more closely matches the lattice parameter of the first layer of superlattice 103 than the lattice parameter of substrate 301. Thus for example, where substrate 301 is sapphire and the first layer of superlattice 103 to be deposited is AlN, GaN or an $Al_xGa_{1-x}N$ alloy, optional buffer layer 302 may be formed from AlN, GaN, or an $Al_xGa_{1-x}N$ alloy. In instances where optional buffer layer 302 is used, superlattice 103 may serve as a transition between optional buffer layer 302 and an overlayer, such as n-type semiconductive layer 304.

N-type semiconductive layer 304 may be formed from any suitable n-type semiconductive material, such as those suitable for use in optoelectronic devices. As non-limiting examples of such materials, mention is made of n-doped aluminum gallium nitrides. Without limitation, n-type semiconductive layer 304 is preferably formed from an aluminum gallium nitride of the formula $Al_zGa_{1-z}N$, wherein z is less than 1 and greater than 0, such as less than or equal to about 0.8 and greater than or equal to about 0.2, or even less than or equal to about 0.6 and greater than or equal to about 0.4. In some embodiments, n-type semiconductive layer 304 is formed from n-doped $Al_{0.47}Ga_{0.53}N$, as shown in FIGS. 4 and 5.

Active region 305 generally functions to emit light, e.g., in response to the recombination of one or more electrons and holes. Active region 305 may therefore be any active region that is suitable for this purpose. For example, active region 305 may be in the form of a multiple quantum well heterostructure (MQW) that is configured to emit visible and or ultraviolet light. In some embodiments, active region 305 is an MQW that includes one or more layers of aluminum gallium nitride of the formula $Al_aGa_{1-a}N$, wherein a ranges from greater than 0.1 to about 0.7, such as greater than 0.4 to about 0.7, or even greater than 0.5 to about 0.7. Without limitation, active region 305 is an MQW formed from multiple periods including first and second $Al_xGa_{1-x}N$ layers, wherein the first and second $Al_xGa_{1-x}N$ layers differ in composition. For example, active region 305 may be formed from 1-10 two layer periods, wherein each period includes a first $Al_aGa_{1-a}N$ layer and a second $Al_aGa_{1-a}N$ layer, wherein a is different in the first and second $Al_aGa_{1-a}N$ layers. In some embodiments active region 305 is formed of five two layer periods, wherein each period includes a layer of $Al_{0.49}Ga_{0.51}N$ and a layer of $Al_{0.7}Ga_{0.3}N$.

P-type semiconductive layer 306 may be formed from any p-type semiconductive material that is suitable for use in an optoelectronic device. As non-limiting examples of suitable p-type semiconductive materials that may be used, mention is made of p doped $Al_xGa_{1-x}N$ alloys, GaN, combinations thereof, and the like. Without limitation, p-type semiconductive layer 306 is preferably formed from an aluminum gallium nitride of the formula $Al_bGa_{1-b}N$, wherein b is less than 1 and greater than 0, such as less than or equal to about 0.8 and greater than or equal to about 0.2, or even less than or equal to about 0.6 and greater than or equal to about 0.4. In some embodiments, p-type semiconductive layer 306 is formed from p-doped $Al_{0.57}Ga_{0.43}N$ and/or $Al_{0.49}a_{0.51}N$. In some embodiments, p-type semiconductive layer 306 includes one or more two-layer periods including first and second p-type semiconductive layers, wherein the first p-type layers are formed from a first $Al_xGa_{1-x}N$ alloy and the second p-type layers are formed from a second $Al_xGa_{1-x}N$ alloy. For example, p-type semiconductive layer 306 may be formed from 1-10 two layer periods, wherein each period includes a first p-doped layer of $Al_{0.57}Ga_{0.43}N$ and a second p-doped layer of $Al_{0.49}Ga_{0.51}N$.

Consistent with the discussion of FIGS. 1 and 2, n-type semiconductive layer 304 and substrate 301 (or buffer layer 302) may have significantly different lattice parameters. For example, where n-type semiconductive layer is an $Al_xGa_{1-x}N$ alloy and substrate 301 is sapphire, the lattice parameter of such layers may differ by as much as 13%. As a result, if n-type semiconductive layer 304 were deposited directly on substrate 301 (e.g., using a physical or chemical vapor deposition process), misfit strain would build in n-type semiconductive layer 304, eventually resulting in the formation of misfit dislocations. Such dislocations may negatively impact the performance of LED 300, particularly in instances where active region 305 is configured to emit ultraviolet light.

In part to address this issue, LED 300 includes superlattice 103, which may be configured as described above in connection with FIGS. 1 and 2. For example, superlattice 103 may include a plurality of periods each of which include at least first and second layer that differ in composition, wherein the superlattice is configured to meet one or a combination of relationships 1 through 8 described above. The manner in which such relationships may be achieved has been described above, and thus is not reiterated for the sake of brevity. Without limitation, superlattice 103 is preferably configured such that it meets all of relationships 1-8 described above.

To further illustrate the concepts described herein, the present disclosure will now proceed to describe two hypothetical exemplary LEDs that include a superlattice consistent with the present disclosure. Such examples are illustrative only, and should not be considered to limit the scope of the present disclosure.

Reference is therefore made to FIG. 4, which depicts one non-limiting hypothetical example of an LED including a superlattice consistent with the present disclosure. As shown, LED 400 includes substrate 301, which in this case is formed from sapphire. A 500 nm buffer layer of AlN is formed on the upper surface of substrate 301. Superlattice 103 is formed on buffer layer 302, and serves as a transition between buffer layer 302 and n-doped semiconductive layer 304, which in this example is 1 micron thick layer of n-doped $Al_{0.57}Ga_{0.43}N$. A multiple quantum well structure (e.g., 5 two layer periods of $Al_{0.49}GA_{0.51}N$ at 38 angstroms and $Al_{0.70}Ga_{0.30}N$ at 128 angstroms) is formed as an active region on n-doped semiconductive layer, and is configured to emit ultraviolet light. A p-type semiconductive layer 306 (e.g., five three layer periods of p-$Al_{0.57}Ga_{0.43}N$ at 20 nm, p-$Al_{0.49}Ga_{0.51}N$ at 400 nm, and p-GaN at 50 nm) is then formed on active region 305.

As shown in FIG. 4, superlattice 103 in this example is formed on an upper surface of buffer layer 302, and is formed by $200_y$ periods, each of which include alternating first and second layers 201, 202. In this example, y=5, first layers 201 are AlN deposited to a thickness $T_1$ of 24.9 angstroms, and second layers 202 are GaN deposited to a thickness $T_2$ of 23.35 angstroms. Accordingly, the thickness $T_{SL}$ of superlattice 103 is 241.25 angstroms.

The average weighted composition of superlattice 103 was determined by weighting the concentration of each element in the compositions of the first and second layers by the thickness of the respective thickness in which they appear, and dividing the result by $T_{SL}$. In this case, the average weighted composition of superlattice 103 was determined to be $Al_{0.53}Ga_{0.47}N$. The average weighted composition of the superlattice therefore differed from the composition of n-type semiconductive layer 304 by about 8.6% in aluminum concentration and about 11.6% in gallium concentration. The weighted average in-plane lattice parameter of the superlattice was determined to be less than 0.1% different than the in-plane lattice parameter of n-type semiconductive layer 304.

Reference is now made to FIG. 5, which depicts another hypothetical example of an LED consistent with the present disclosure. As shown, LED 500 includes substrate 301, buffer layer 302, n-type semiconductive layer 304, active region 305, and p-type semiconductive layer 306, each of which are configured in the same manner as described above in connection with LED 400 and FIG. 4. A description of such components is therefore not reiterated. As further shown, LED 500 includes superlattice 103, which is formed from a plurality of periods $200_y$. In this example however, y=9, each first layer is AlN at 24.9 angstroms, and each second layer 202 is $Al_{0.10}Ga_{0.90}N$ at 25.84 angstroms. Accordingly, the thickness $T_{SL}$ of superlattice 103 in FIG. 5 is 456.7 angstroms.

The average weighted composition of superlattice 103 in FIG. 5 was determined by weighting the concentration of each element in the compositions of the first and second layers by the total thickness of the respective layers in which they appear, and dividing the result by $T_{SL}$. In this case, the average weighted composition of the superlattice was determined to be $Al_{0.55}Ga_{0.45}N$. The average weighted composition of the superlattice therefore differed from the composition of n-type semiconductive layer 304 by about 3.5% in aluminum concentration and about 4.7% in gallium concentration. The weighted average in-plane lattice parameter of the superlattice was determined to be less than 0.05% different than the in-plane lattice parameter of n-type semiconductive layer 304. This allowed for n-layer 304 to be deposited to a thickness of up to about 2732 angstroms without the generation of misfit dislocations.

However, because superlattice 103 in FIG. 5 used an $Al_xGa_{1-x}N$ alloy to form second layers 202, the strength of superlattice 103 of FIG. 5 was somewhat less than that of superlattice 103 in FIG. 4. As a result, it is expected that the superlattice of FIG. 5 may be somewhat less effective than the superlattice of FIG. 4 at isolating defects that may be present in the AlN buffer layer 302.

Figure 6:
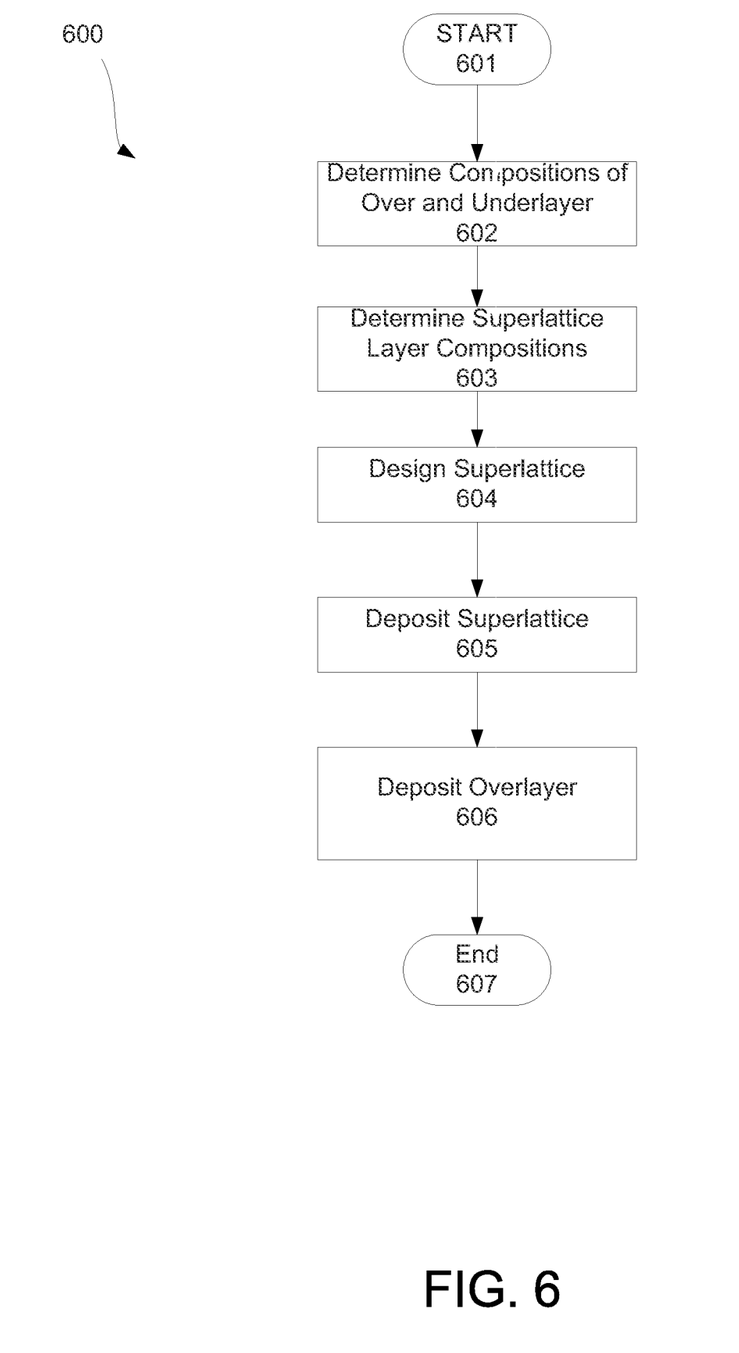
FIG. 6 is a flow diagram of operations in an exemplary method of forming a structure to transition between two layers that have different lattice parameters, consistent with the present disclosure.

Another aspect of the present disclosure relates to methods of forming a structure to transition between two layers of differing lattice parameters, e.g., overlayer 102 and underlayer 101 described. Reference is therefore made to FIG. 6, which is a flow diagram depicting operations of an exemplary method consistent with the present disclosure. As shown, method 600 begins at block 601. At block 602, a determination may be made as to the composition of the underlayer (e.g., substrate) and overlayer (e.g., n-type semiconductive layer) that are to be used. Once this determination is made, the method may proceed to block 603, wherein a determination may be made as to the compositions that will be used to form the layers of a superlattice structure to transition between the overlayer and underlayer.

As discussed above, the composition of the layers used in a superlattice may be determined based on numerous factors such as the difference in the lattice parameters between the over and underlayer, the composition of the underlayer, the composition of the overlayer, the critical thickness of the resulting layers, deposition considerations (e.g., whether a composition may be deposited to a desired thickness using reasonable techniques), etc. In some embodiments, the superlattice is formed by a plurality of periods including at least first and second layers, and the first and second layer compositions are selected based at least in part on the composition of the overlayer. For example, the compositions of the first and second layers may be selected such that the average weighted composition of the superlattice is equal or nearly equal (e.g., +/15%) of the composition of the overlayer.

Once the superlattice materials have been selected, the method may proceed to block 604, wherein the superlattice structure may be designed. As explained above in connection with FIGS. 1 and 2, various parameters such as the thickness of each layer in a superlattice, each period, and/or the superlattice as a whole may be controlled to achieve desired performance characteristics. For example, the superlattice may be designed to meet one or a combination of relationships 1-8 specified above.

Once the superlattice has been designed, the process may proceed to block 605, wherein the superlattice may be deposited on the underlayer. Deposition of the constituent layers of the superlattice may be performed using any suitable deposition technique, including physical vapor deposition, chemical vapor deposition, molecular beam epitaxy, etc. After deposition of the superlattice, the method may proceed to block 606, wherein the overlayer is deposited on the superlattice. As mentioned above, because the superlattice has a lattice parameter that matches or substantially matches the lattice parameter of the overlayer, the overlayer may be grown epitaxially over the superlattice without the introduction of misfit strain, and/or with a reduced amount of misfit strain (relative to the strain that would be introduced if the overlayer were deposited directly on the underlayer).

While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art are considered to be within the scope of the present invention, which is not to be limited except by the following claims.

What is claimed is:

1. A structure to transition between two layers of differing lattice parameters, comprising:
   a superlattice on a bottom layer of said two layers, the superlattice comprising a plurality of alternating a first layer and a second layer, the first and second layers having respective first and second critical thicknesses, $h_{c1}$ and $h_{c2}$, wherein a thickness $T_1$ of the first layer is less than $h_{c1}$ and a thickness $T_2$ of the second layer is less than $h_{c2}$;
   wherein said superlattice has an average weighted composition and lattice parameter that substantially match a composition and lattice parameter of a top layer of said two layers, said top second layer of said two layers to be deposited on said superlattice; and
   wherein said superlattice comprises a plurality of periods comprising one of said first layers and one of said second layers, wherein each period of said plurality of periods has a thickness $T_p$ and a critical thickness $h_{cp}$, and the thickness $T_p$ of each of said plurality of periods is less than $h_{cp}$, wherein $T_p$ and hcp may be the same or different for each of said plurality of periods.

2. The structure of claim 1, wherein said superlattice has a thickness $T_{sl}$ and a critical thickness $h_{csl}$, wherein $T_{sl}$ is greater than $h_{csl}$.

3. The structure of claim 1, wherein said first layers comprise a first metal nitride and said second layers comprise a second metal nitride.

4. The structure of claim 3, wherein said first layer comprises an aluminum nitride and said second layer comprises a gallium nitride.

5. The structure of claim 4, wherein said first layers are formed from AlN and said second layers are formed from at least one of GaN and $Al_xGa_{1-x}N$, where 0<x<1.

6. The structure of claim 1, wherein said lattice parameter of said superlattice is an in-plane lattice parameter of said superlattice, and said lattice parameter of the top layer of said two layers is an in plane lattice parameter of the top layer of said two layers.

7. The structure of claim 1, wherein said top layer of said two layers of differing lattice parameters is a semiconductive layer comprising aluminum, and said average weighted composition of said superlattice contains aluminum in an amount greater than the amount of aluminum in said semiconductive layer.

8. The structure of claim 7, wherein said bottom layer of said two layers of differing lattice parameters is sapphire.

9. The structure of claim 1, wherein said structure is capable of transmitting ultraviolet light.

10. A light emitting diode, comprising:
    a substrate having a first lattice parameter;
    a superlattice on said substrate, the superlattice comprising a plurality of alternating first and second layers, the first and second layers having respective first and second critical thicknesses, $h_{c1}$ and $h_{c2}$, wherein a thickness $T_1$ of the first layer is less than $h_{c1}$ and a thickness $T_2$ of the second layer $T_2$ is less than $h_{c2}$;
    a semiconductive layer having a first composition and a second lattice parameter formed on said superlattice; and
    a light emitting active layer formed on said semiconductive layer;
    wherein:
    said second lattice parameter is different from said first lattice parameter said superlattice has an average weighted composition that substantially matches said first composition; and
    said superlattice has a lattice parameter that substantially matches said second lattice parameter; and
    wherein said superlattice comprises a plurality of periods comprising one of said first layers and one of said second layers, wherein each period of said plurality of periods has a thickness $T_p$ and a critical thickness hcp, and the thickness $T_p$ of each of said plurality of periods is less than $h_{cp}$, wherein T and $h_{cp}$ may be the same or different for each of said plurality of periods.

11. The light emitting diode of claim 10, wherein said superlattice has a thickness $T_{sl}$ and a critical thickness $h_{csl}$, wherein $T_{sl}$ is greater than $h_{csl}$.

12. The structure of claim 10, wherein said first layers comprise a first metal nitride and said second layers comprise a second metal nitride.

13. The structure of claim 10, wherein said lattice parameter of said superlattice is an in-plane lattice parameter of said superlattice, and said lattice parameter of said semiconductive layer is an in-plane lattice parameter of said semiconductive layer.

14. The structure of claim 10, wherein said first composition comprises aluminum, and said average composition of said superlattice contains aluminum in an amount substantially equal to the amount of aluminum in said first composition.

15. The structure of claim 10, wherein said structure is capable of transmitting ultraviolet light.

16. The structure of claim 10, wherein said superlattice is configured to transmit ultraviolet light emitted by said active layer.

17. The structure of claim 10, wherein said first layer comprises an aluminum nitride, a gallium nitride, an aluminum gallium nitride or a combination thereof, said second layer comprises an aluminum nitride, a gallium nitride, an aluminum gallium nitride, or a combination thereof, and said first and second layers differ in composition.

18. The structure of claim 17, wherein said first layers are formed from AlN and said second layers are formed from at least one of GaN and $Al_xGa_{1-x}N$, where $0<x<1$.

19. The structure of claim 17, wherein said substrate is sapphire.

\* \* \* \* \*